(12) United States Patent
Shi et al.

(10) Patent No.: US 12,183,431 B2
(45) Date of Patent: Dec. 31, 2024

(54) SEMICONDUCTOR STRUCTURE AND CHIP

(71) Applicant: CHANGXIN MEMORY TECHNOLOGIES, INC., Hefei (CN)

(72) Inventors: Haofan Shi, Hefei (CN); Sang Pil Park, Hefei (CN); Jaeyong Cha, Hefei (CN); Junghwa Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 170 days.

(21) Appl. No.: 18/151,515

(22) Filed: Jan. 9, 2023

(65) Prior Publication Data

US 2023/0360685 A1 Nov. 9, 2023

Related U.S. Application Data

(63) Continuation of application No. PCT/CN2022/095316, filed on May 26, 2022.

(30) Foreign Application Priority Data

May 7, 2022 (CN) .......................... 202210495446.0

(51) Int. Cl.
*G11C 8/08* (2006.01)
*H01L 23/528* (2006.01)
(52) U.S. Cl.
CPC ............ *G11C 8/08* (2013.01); *H01L 23/5283* (2013.01)
(58) Field of Classification Search
CPC ........... G11C 8/08; G11C 7/10; G11C 7/1003; G11C 7/1069; H01L 23/5283
See application file for complete search history.

(56) References Cited

U.S. PATENT DOCUMENTS

| 7,729,195 | B2 | 6/2010 | Youn |
| 9,318,175 | B1 | 4/2016 | Chi |
| 9,583,152 | B1 | 2/2017 | Jeong |
| 10,490,256 | B2 | 11/2019 | Jeong |
| 2008/0112253 | A1 | 5/2008 | Youn |
| 2008/0197419 | A1 | 8/2008 | Liaw |
| 2010/0046313 | A1* | 2/2010 | Lee ..................... G11C 11/4085 365/230.06 |
| 2010/0213552 | A1 | 8/2010 | Liaw |

(Continued)

FOREIGN PATENT DOCUMENTS

| CN | 101246888 A | 8/2008 |
| CN | 105719684 A | 6/2016 |

(Continued)

*Primary Examiner* — Han Yang
(74) *Attorney, Agent, or Firm* — Syncoda LLC; Feng Ma

(57) ABSTRACT

A semiconductor structure and a chip are provided. The semiconductor structure includes: a first active area and a second active area extending along a first direction and having a first width in a second direction; a first WordLine (WL) drive transistor group including two gate dielectric areas connected to the first active area; a second WL drive transistor group including two gate dielectric areas connected to the first active area; a third WL drive transistor group including two gate dielectric areas connected to the second active area; and a fourth WL drive transistor group including two gate dielectric areas connected to the second active area. Each of the gate dielectric area extends along the second direction and has a second width in the first direction.

16 Claims, 7 Drawing Sheets

(56) References Cited

U.S. PATENT DOCUMENTS

| | | |
|---|---|---|
| 2013/0026580 A1 | 1/2013 | Morimoto |
| 2015/0102421 A1 | 4/2015 | Morimoto et al. |
| 2016/0043091 A1 | 2/2016 | Morimoto et al. |
| 2016/0276352 A1 | 9/2016 | Morimoto et al. |
| 2017/0271344 A1 | 9/2017 | Morimoto et al. |
| 2019/0006375 A1 | 1/2019 | Morimoto et al. |
| 2021/0167090 A1 | 6/2021 | Yu et al. |
| 2023/0050443 A1* | 2/2023 | Smith ................ H01L 29/0692 |

FOREIGN PATENT DOCUMENTS

| | | |
|---|---|---|
| CN | 107275327 A | 10/2017 |
| CN | 112885829 A | 6/2021 |

\* cited by examiner

SEMICONDUCTOR STRUCTURE AND CHIP

CROSS-REFERENCE TO RELATED APPLICATIONS

The present disclosure is a continuation of International Patent Application No. PCT/CN2022/095316, filed on May 26, 2022, which claims priority to Chinese patent application No. 202210495446.0, filed on May 7, 2022. The contents of International Patent Application No. PCT/CN2022/095316 and Chinese patent application No. 202210495446.0 are hereby incorporated by reference in their entireties.

BACKGROUND

A WL drive circuit is an important circuit in a memory. The WL drive circuit usually includes multiple WL drive sub-circuits. A Main-WordLine (MWL) in each WL drive sub-circuit drives multiple Sub-WordLines (SWL) through a circuit built by transistors, so as to realize the transmission of WL signals in the memory. In the layout, the circuits connected to the same MWL are usually laid out centrally, and multiple WL drive sub-circuits are also usually laid out centrally, which puts forward higher requirements for layout design.

In order to realize the centralized layout of the WL drive circuits, wiring and layout are usually adjusted accordingly, so as to obtain a better electrical signal transmission effect while meeting the design specifications. At present, the layout has different problems, for example, there are island areas and more curved signal lines, which lead to various performance attenuations of the electrical signal transmission effect. Therefore, a layout structure of the WL drive circuits with better electrical signal transmission effect is needed.

It is to be noted that some of the information disclosed in the above background is used only to enhance the understanding of the background of the present disclosure, and thus may include information not constituting the conventional art known to those of ordinary skill in the art.

SUMMARY

The present disclosure relates to the technical field of integrated circuit manufacturing, and in particular to a semiconductor structure, and a chip applying the semiconductor structure.

A first aspect of the present disclosure provides a semiconductor structure, which includes: a first active area, a second active area, a first WL drive transistor group, a second WL drive transistor group, a third WL drive transistor group and a fourth WL drive transistor group. The first active area is configured to extend along a first direction and have a first width in a second direction, the second direction is perpendicular to the first direction. The second active area is configured to extend along the first direction and have the first width in the second direction. The first WL drive transistor group is formed based on the first active area and includes two gate dielectric areas connected to the first active area. One of the two gate dielectric areas is connected to an MWL, and the other of the two gate dielectric areas is connected to a first control signal line. The second WL drive transistor group is formed based on the first active area and includes two gate dielectric areas connected to the first active area. One of the two gate dielectric areas is connected to the MWL, and the other of the two gate dielectric areas is connected to a second control signal line. The third WL drive transistor group is formed based on the second active area and includes two gate dielectric areas connected to the second active area. One of the two gate dielectric areas is connected to the MWL, and the other of the two gate dielectric areas is connected to a third control signal line. The fourth WL drive transistor group is formed based on the second active area and includes two gate dielectric areas connected to the second active area. One of the two gate dielectric areas is connected to the MWL, and the other of the two gate dielectric areas is connected to a fourth control signal line. Each of the gate dielectric areas is configured to extend along the second direction and have a second width in the first direction.

A second aspect of the present disclosure provides a semiconductor structure, which is configured to be provided with multiple WL drive circuits of a memory, the multiple WL drive circuits are connected to the MWL and multiple SWLs respectively corresponding to multiple WL drive circuits, the semiconductor structure includes: a first layout area, a second layout area and a third layout area. The first layout area is configured to be provided with multiple P-type transistors corresponding to multiple WL drive circuits. For each P-type transistor, a gate of the P-type transistor is connected to the MWL, a drain of the P-type transistor is connected to a respective SWL of the corresponding WL drive circuit, and a source of the P-type transistor is connected to a power supply voltage. The second layout area includes multiple semiconductor structures in the first aspect. The multiple semiconductor structures in the second layout area share a first active area and a second active area. The third layout area includes multiple semiconductor structures in the first aspect. The semiconductor structures in the third layout area share a further first active area and a further second active area. The second layout area, the first layout area and the third layout area are sequentially arranged in parallel in the second direction.

A third aspect of the present disclosure provides a chip, which includes the semiconductor structure in the first aspect and/or second aspect.

It is to be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate embodiments in accordance with the present disclosure and, together with the description, serve to explain the principles of the present disclosure. It is apparent that the accompanying drawings in the following description are only some embodiments of the present disclosure, for those of ordinary skill in the art, some other accompanying drawings may also be obtained according to these drawings without any creative effort.

DETAILED DESCRIPTION

Figure 1:
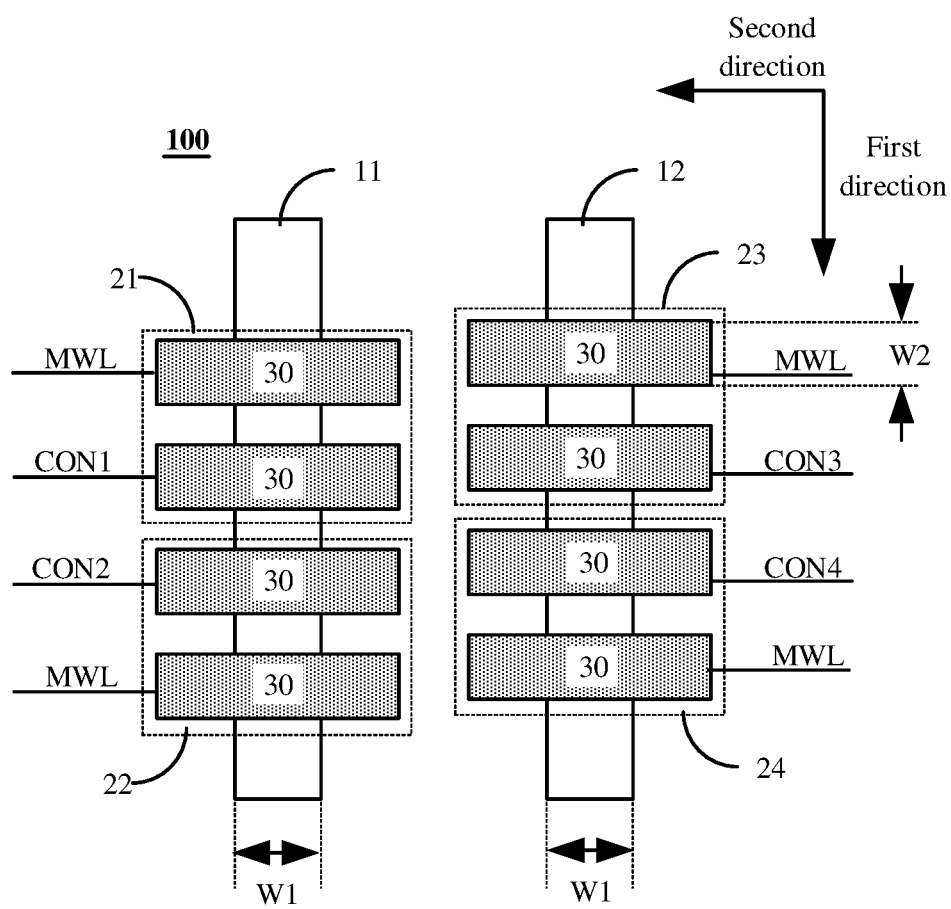
FIG. 1 is a structure diagram of a semiconductor structure in an exemplary embodiment of the present disclosure.

Exemplary implementations will be described more comprehensively with reference to the accompanying drawings. However, the exemplary implementations can be implemented in many forms and should not be understood to be limited to the examples described here; on the contrary, the provision of these implementations allows the present disclosure to be more comprehensive and complete, and fully communicates the concept of the exemplary implementations to those skilled in the art. The described characteristics, structures, or features can be combined in one or more implementations in any proper way. In the following descriptions, many specific details are provided to give a full understanding of the implementations of the present disclosure. However, those skilled in the art will appreciate that the technical solution of the disclosure may be practiced while omitting one or more of the specific details, or other methods, components, apparatuses, steps, etc. may be employed. In other instances, the well-known technical solutions are not shown or described in detail, so as to avoid obscuring various aspects of the disclosure.

In addition, the accompanying drawings are merely schematic illustrations of the present disclosure. The same reference signs in the drawings denote the same or similar parts, so repeated description thereof will be omitted. Some block diagrams shown in the drawings are functional entities and do not necessarily have to correspond to physically or logically separate entities. These functional entities may be implemented in software, or in one or more hardware modules or integrated circuits, or in different networks and/or processor apparatuses and/or micro-controller apparatuses.

The exemplary implementations of the present disclosure are elaborated below in combination with the accompanying drawings.

FIG. 1 is a structure diagram of a semiconductor structure in an exemplary embodiment of the present disclosure, which is capable of improving the transmission performance of WL drive circuits.

With reference to FIG. 1, a semiconductor structure 100 may include: a first active area 11, a second active area 12, a first WL drive transistor group 21, a second WL drive transistor group 22, a third WL drive transistor group 23, a fourth WL drive transistor group 24.

The first active area 11 extends along a first direction and has a first width W1 in a second direction, the second direction is perpendicular to the first direction.

The second active area 12 extends along the first direction and has the first width W1 in the second direction.

The first WL drive transistor group 21 is formed based on the first active area 11, and includes two gate dielectric areas 30 connected to the first active area 11. One of the two gate dielectric areas 30 is connected to an MWL, and the other of the two gate dielectric areas 30 is connected to a first control signal line CON1.

The second WL drive transistor group 22 is formed based on the first active area 11, and includes two gate dielectric areas 30 connected to the first active area 11. One of the two gate dielectric areas 30 is connected to the MWL, and the other of the two gate dielectric areas 30 is connected to a second control signal line CON2.

The third WL drive transistor group 23 is formed based on the second active area 12, and includes two gate dielectric areas 30 connected to the second active area 12. One of the two gate dielectric areas 30 is connected to the MWL, and the other of the two gate dielectric areas 30 is connected to a third control signal line CON3.

The fourth WL drive transistor group 24 is formed based on the second active area 12, and includes two gate dielectric areas 30 connected to the second active area 12. One of the two gate dielectric areas 30 is connected to the MWL, and the other of the two gate dielectric areas 30 is connected to a fourth control signal line CON4.

Each of the gate dielectric areas 30 is configured to extend along the second direction and have a second width W2 in the first direction.

In the embodiments of the present disclosure, by using two active areas with uniform width to implement four WL drive transistor groups and setting each gate dielectric area in each WL drive transistor group to be a rectangle with the same width, it can form a uniform conductive channels, eliminate island areas in the layout, reduce the stress of STI, and improve the structure stability. At the same time, the filling effect of metal wiring is improved, the defect rate of the manufacturing process is decreased, the difficulty of production is decreased, and the production efficiency and product yield is improved. In addition, it is also convenient to monitor and optimize device performance in Wafer Acceptable Test (WAT).

With the semiconductor structure provided in the embodiments of the present disclosure, by arranging four WL drive transistor groups respectively on two straight active areas with equal width, and arranging the width of the gate dielectric areas of the four WL drive transistor groups equal, uniform and consistent charge paths can be formed, the four WL drive transistor groups are controlled to have the same electrical property, and the conductivity of the WL drive transistor group is improved, thereby improving the transmission effect of the electrical signals of the WL drive circuits.

Figure 2A:
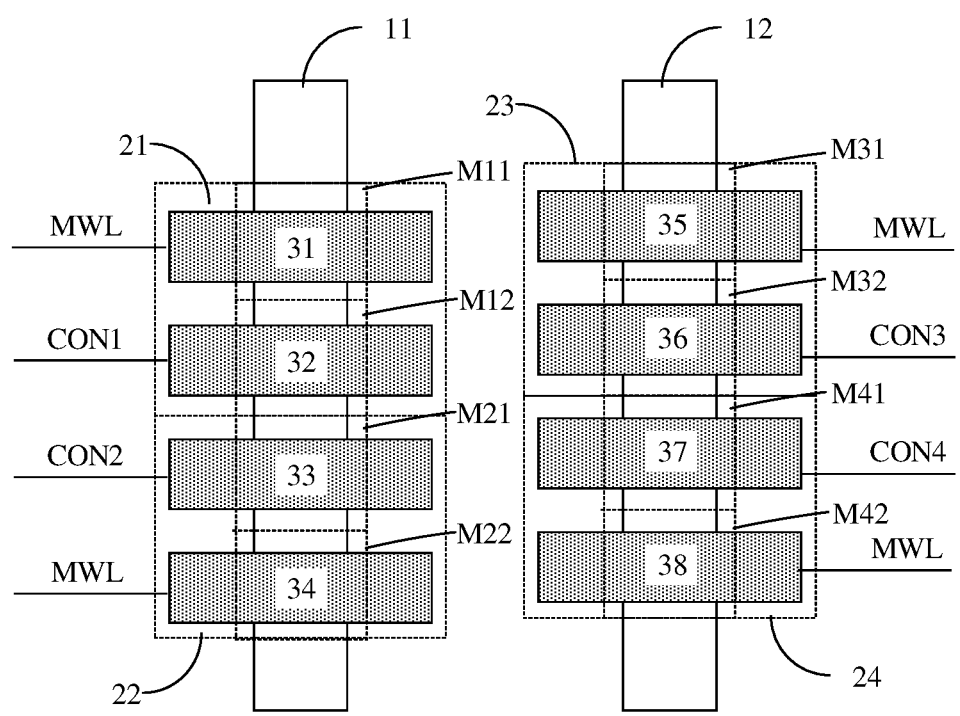
FIG. 2A illustrates a layout of four WL drive transistor groups in an embodiment of the present disclosure.
Figure 2B:
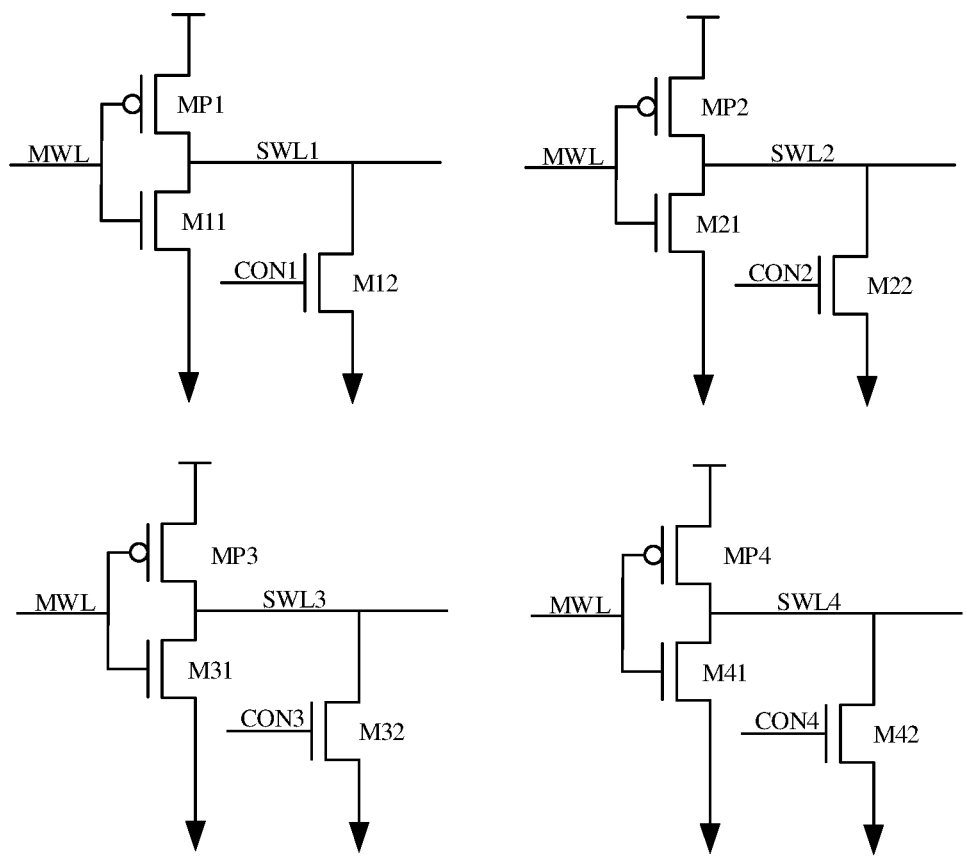
FIG. 2B illustrates the circuits corresponding to the layout shown in FIG. 2A in an embodiment.

FIG. 2A and FIG. 2B are schematic diagrams of the correspondence between the semiconductor structure 100 and the WL drive circuits in the embodiments of the present disclosure. FIG. 2A illustrates the layout of four WL drive transistor groups in an embodiment of the present disclosure, and FIG. 2B illustrates the circuits corresponding to the layout shown in FIG. 2A in an embodiment.

With reference to FIG. 2A and FIG. 2B, in an exemplary embodiment of the present disclosure, the first WL drive transistor group 21 includes a first transistor M11 and a second transistor M12, a gate of the first transistor M11 is a first gate dielectric area 31, a gate of the second transistor M12 is a second gate dielectric area 32, and a part, located between the first gate dielectric area 31 and the second gate dielectric area 32, of the first active area 11 is a common drain of the first transistor M11 and the second transistor M12.

The second WL drive transistor group 22 includes a third transistor M21 and a fourth transistor M22, a gate of the third transistor M21 is a third gate dielectric area 33, a gate of the fourth transistor M22 is a fourth gate dielectric area 34, and a part, located between the third gate dielectric area 33 and the fourth gate dielectric area 34, of the first active area 11 is a common drain of the third transistor M21 and the fourth transistor M22.

The third WL drive transistor group 23 includes a fifth transistor M31 and a sixth transistor M32, a gate of the fifth transistor M31 is a fifth gate dielectric area 35, a gate of the sixth transistor M32 is a sixth gate dielectric area 36, and a part, located between the fifth gate dielectric area 35 and the sixth gate dielectric area 36, of the second active area 12 is a common drain of the fifth transistor M31 and the sixth transistor M32.

The fourth WL drive transistor group 24 includes a seventh transistor M41 and an eighth transistor M42, a gate of the seventh transistor M41 is a seventh gate dielectric area 37, a gate of the eighth transistor M42 is an eighth gate dielectric area 38, and a part, located between the seventh gate dielectric area 37 and the eighth gate dielectric area 38, of the second active area 12 is a common drain of the seventh transistor M41 and the eighth transistor M42.

In an exemplary embodiment of the present disclosure, the first gate dielectric area 31, the second gate dielectric area 32, the third gate dielectric area 33 and the fourth gate dielectric area 34 are sequentially arranged on the first active area 11 in parallel along the first direction; the fifth gate dielectric area 35, the sixth gate dielectric area 36, the seventh gate dielectric area 37 and the eighth gate dielectric area 38 are sequentially arranged on the second active area 12 in parallel along the first direction; the first gate dielectric area 31, the fourth gate dielectric area 34, the fifth gate dielectric area 35, and the eighth gate dielectric area 38 are connected to the MWL; the second gate dielectric area 32 is connected to the first control signal line CON1, the third gate dielectric area 33 is connected to the second control signal line CON2, the sixth gate dielectric area 36 is connected to the third control signal line CON3, and the seventh gate dielectric area 37 is connected to the fourth control signal line CON4.

With reference to FIG. 2B, in an embodiment, the first WL drive transistor group 21 further includes a first P-type transistor MP1, the second WL drive transistor group 22 further includes a second P-type transistor MP2, the third WL drive transistor group 23 further includes a third P-type transistor MP3, and the fourth WL drive transistor group 24 further includes a fourth P-type transistor MP4. A source of the first P-type transistor MP1 is connected to a power supply, a gate of the first P-type transistor is connected to the MWL, and a drain of the first P-type transistor is connected to the drain of the first transistor M11 and the first SWL SWL1. A source of the second P-type transistor MP2 is connected to the power supply, a gate of the second P-type transistor is connected to the MWL, and a drain of the second P-type transistor is connected to the drain of the third transistor M21 and the second SWL SWL2. A source of the third P-type transistor MP3 is connected to the power supply, a gate of the third P-type transistor is connected to the MWL, and a drain of the third P-type transistor is connected to the drain of the fifth transistor M31 and the third SWL SWL3. A source of the fourth P-type transistor MP4 is connected to the power supply, a gate of the fourth P-type transistor is connected to the MWL, and a drain of the fourth P-type transistor is connected to the drain of the seventh transistor M41 and the fourth SWL SWL4.

Although the circuits shown in FIG. 2B is taken as the source of the layout shown in FIG. 2A in the present disclosure, in other embodiments of the present disclosure, the layout shown in FIG. 2A may also be applied to the layout of other similar circuits or other WL drive circuits to improve the electrical signal transmission effect of the transistors laid out centrally. The layout in the embodiments of the present disclosure is not limited to the WL drive circuits shown in FIG. 2B.

Figure 3:
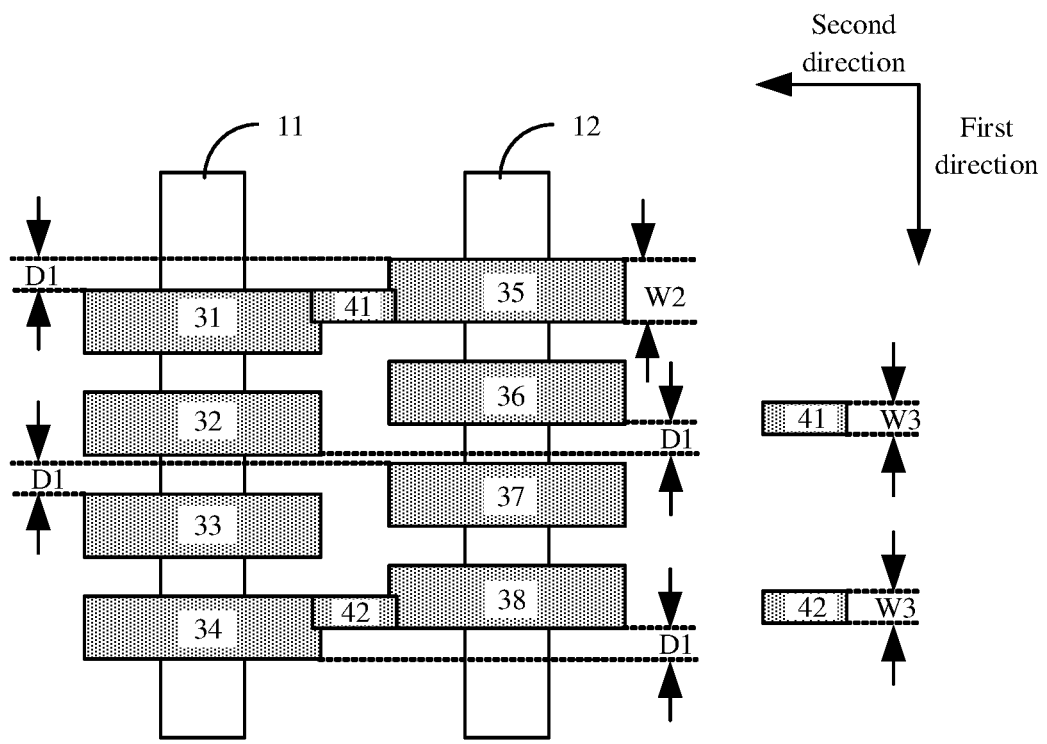
FIG. 3 is a schematic diagram of a semiconductor structure in an embodiment of the present disclosure.

FIG. 3 is a schematic diagram of a semiconductor structure in an embodiment of the present disclosure.

With reference to FIG. 3, in an exemplary embodiment of the present disclosure, the first gate dielectric area 31 is connected to the fifth gate dielectric area 35; the fourth gate dielectric area 34 is connected to the eighth gate dielectric area 38; the first gate dielectric area 31 and the fifth gate dielectric area 35 have a first distance D1 in the first direction; the fourth gate dielectric area 34 and the eighth gate dielectric area 38 have the first distance D1 in the first direction.

At the same time, the second gate dielectric area 32 and the sixth gate dielectric area 36 may also be arranged to have the first distance D1 in the first direction, and the third gate dielectric area 33 and the seventh gate dielectric area 37 may also be arranged to have the first distance D1 in the first direction.

In an embodiment, the first gate dielectric area 31 is connected to the fifth gate dielectric area 35 through the first connecting structure 41 which extends along the second direction and has the third width W3 in the first direction, the third width W3 is less than the second width W2. The fourth gate dielectric area 34 is connected to the eighth gate dielectric area 38 through the second connecting structure 42 which extends along the second direction and has the third width W3 in the first direction.

As shown in FIG. 3, in an embodiment, in order to reduce the increase of loading on the wire caused by excessive wiring angles, it may be arranged that the first edge (the top edge in the figure) of the first connecting structure 41 in the first direction is flush with the first edge of the first gate dielectric area 31 in the first direction, and the second edge (the bottom edge in the figure) of the first connecting structure in the first direction is flush with the second edge of the fifth gate dielectric area 35 in the first direction. The first edge of the second connecting structure 42 in the first direction is flush with the first edge of the fourth gate dielectric area 34 in the first direction, and the second edge of the second connecting structure in the first direction is flush with the second edge of the eighth gate dielectric area 38 in the first direction.

Figure 4:
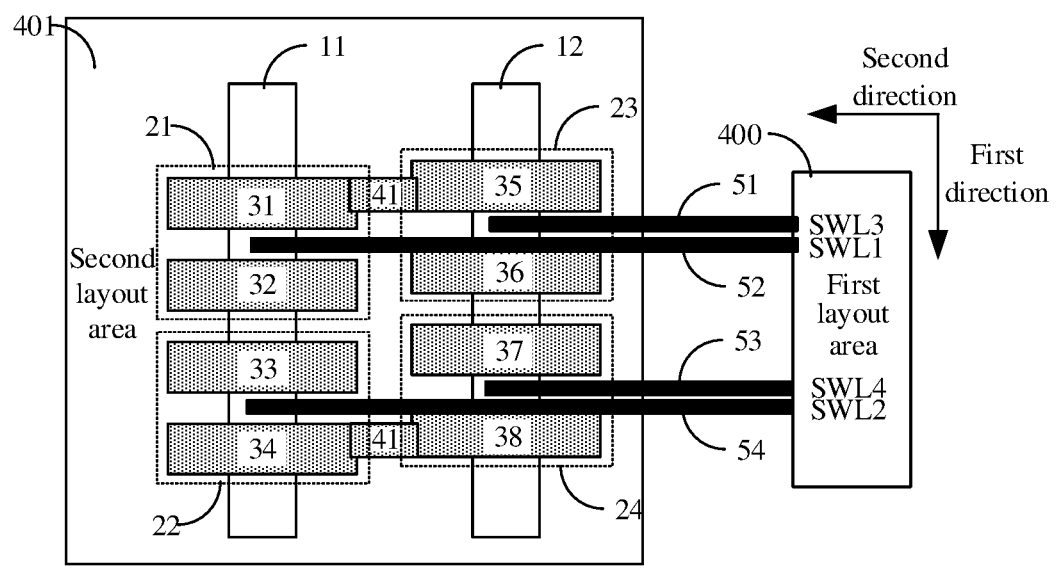
FIG. 4 is a schematic diagram of the effect of the embodiment shown in FIG. 3.

FIG. 4 is a schematic diagram of the effect of the embodiment shown in FIG. 3.

With reference to FIG. 4 and FIG. 2B, in an exemplary embodiment of the present disclosure, the common drain of the first transistor M11 and the second transistor M12 is connected to the first SWL SWL1 corresponding to the first WL drive transistor group 21 through the first wire 52; the common drain of the third transistor M21 and the fourth transistor M22 is connected to the second SWL SWL2 corresponding to the second WL drive transistor group 22 through the second wire 54; the first wire 52 and the second wire 54 are parallel in the first direction, and the first wire 52 and the second wire 54 are on the same metal layer; the common drain of the fifth transistor M31 and the sixth transistor M32 is connected to the third SWL SWL3 corresponding to the third WL drive transistor group 23 through the third wire 51; the common drain of the seventh transistor M41 and the eighth transistor M42 is connected to the fourth SWL SWL4 corresponding to the fourth WL drive transistor group 24 through the fourth wire 53; the third wire 51 and the fourth wire 53 are parallel in the first direction, and the third wire 51 and the fourth wire 53 are on the same metal layer.

In an embodiment, the first SWL SWL1, the second SWL SWL2, the third SWL SWL3 and the fourth SWL SWL4 are arranged in the first layout area 400 and connected to a storage array from the first layout area 400. The first layout area 400 is used to arrange multiple PMOS corresponding to multiple WL drive transistor groups to realize the centralized layout of the PMOS (see FIG. 9 for details).

Combined with the circuit diagram in FIG. 2B, the first wire 52 is connected to the drain of the first P-type transistor MP1 corresponding to the first WL drive transistor group 21, the second wire 54 is connected to the drain of the second P-type transistor MP2 corresponding to the second WL drive transistor group 22, the third wire 51 is connected to the drain of the third P-type transistor MP3 corresponding to the third WL drive transistor group 23, and the fourth wire 53 is connected to the drain of the fourth P-type transistor MP4 corresponding to the fourth WL drive transistor group 24; the first P-type transistor MP1, the second P-type transistor MP2, the third P-type transistor MP3, and the fourth P-type transistor MP4 are all arranged in the first layout area 400; the first active area 11 and the second active area 12 are both arranged in the second layout area 401; the first layout area 400 and the second layout area 401 are arranged in parallel in the second direction.

It can be seen from the embodiment shown in FIG. 4 that, because the gate dielectric areas with uniform width are arranged in staggered manner in the embodiment shown in FIG. 3, the SWLs SWL1 to SWL4 connected to the four WL drive transistor groups laid out centralized are allowed to be arranged flat and straight on the same metal layer and connected to the first layout area 400 corresponding to the WL drive circuits. Because the wiring is uniform and straight without threading layers, the complexity of layout design of a wiring metal layer (i.e., the M0 layer) is reduced, the loading of wires is reduced, the conductive effect of wires is optimized, the manufacturing complexity is reduced, and the production efficiency is improved.

Therefore, setting the first distance may avoid the increase of loading caused by the bending and cross-layer of wiring, and further improve the electrical signal transmission effect of the WL drive circuits.

Figure 5:
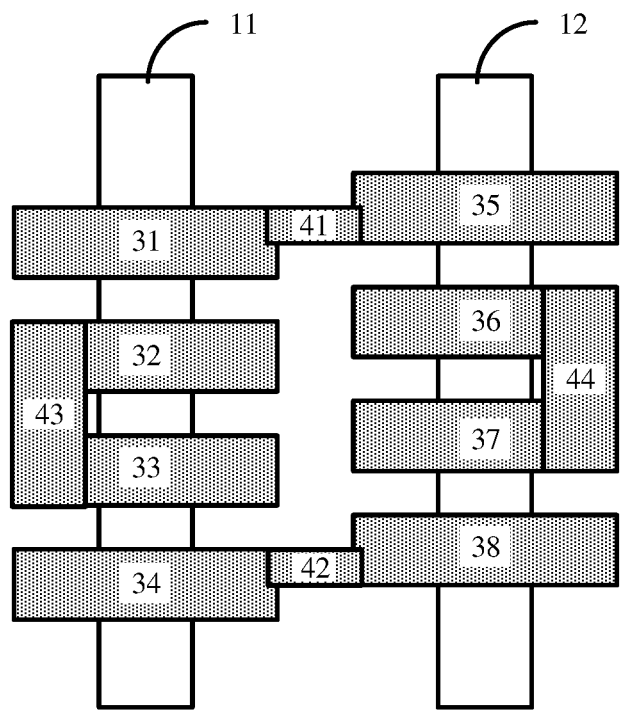
FIG. 5 is a schematic diagram of a semiconductor structure in another embodiment of the present disclosure.

FIG. 5 is a schematic diagram of a semiconductor structure in another embodiment of the present disclosure.

With reference to FIG. 5, in an exemplary embodiment of the present disclosure, the first control signal line CON1 and the second control signal line CON2 are the same signal line; the third control signal line CON3 and the fourth control signal line CON4 are the same signal line; the second gate dielectric area 32 is connected to the third gate dielectric area 33; the sixth gate dielectric area 36 is connected to the seventh gate dielectric area 37.

The second gate dielectric area 32 is connected to the third gate dielectric area 33 through the third connecting structure 43 which extends along the first direction and is located on a side, away from the second active area 12, of the first active area 11 in the second direction; the sixth gate dielectric area 36 is connected to the seventh gate dielectric area 37 through the fourth connecting structure 44 which extends along the first direction and is located on a side, away from the first active area 11, of the second active area 12 in the second direction.

By connecting the gate dielectric areas connected to the same control signal line by the third connecting structure 43 and the fourth connecting structure 44, the wires of the control signal line can be saved and more space is provided for the layout. Moreover, compared with the connection of the gate dielectric areas by directly using wires, the connection between the gate dielectric areas by using the third connecting structure 43 and the fourth connecting structure 44 with larger area is more helpful to make the charges between the gate dielectric areas uniform and enhance the charge transport capability.

In the embodiment shown in FIG. 5, the third connecting structure 43 is connected to a first terminal of the second gate dielectric area 32 and a first terminal of the third gate dielectric area 33; the fourth connecting structure 44 is connected to a second terminal of the sixth gate dielectric area 36 and a second terminal of the seventh gate dielectric area 37. By connecting edges of the third connecting structure 43 and the fourth connecting structure 44 with the edges of each gate dielectric area, the total number of angles of the connected structures can be reduced, thereby reducing the increase of loading caused by excessive wiring angles, reducing the difficulty of wire manufacturing and improving the production efficiency.

In other embodiments of the present disclosure, if other layout considerations are added, the third connecting structure 43 and the fourth connecting structure 44 may also be arranged to be connected with other parts of each gate dielectric area. Those skilled in the art may design the connection position of each connecting structure according to the actual situation, as long as the shapes of the first active area 11, the second active area 12 and the gate dielectric area are not affected.

Figure 6:
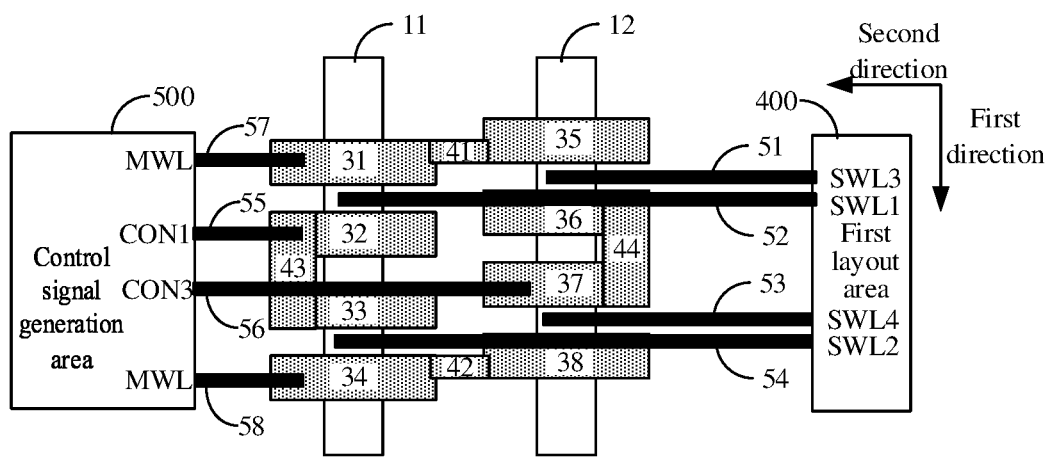
FIG. 6 is a schematic diagram of the effect of the embodiment shown in FIG. 5.

FIG. 6 is a schematic diagram of the effect of the embodiment shown in FIG. 5.

With reference to FIG. 6, in an exemplary embodiment of the present disclosure, the second gate dielectric area 32 is connected to a fifth wire 55, and the sixth gate dielectric area 36 is connected to a sixth wire 56; the fifth wire 55 and the sixth wire 56 are parallel in the first direction, and the fifth wire 55 and the sixth wire 56 are on the same metal layer. The fifth wire 55 is used to connect the first control signal CON1 (the first control signal CON1 and the second control signal CON2 are the same control signal), and the sixth wire 56 is used to connect the third control signal CON3 (the third control signal CON3 and the fourth control signal CON4 are the same control signal).

It can be seen from FIG. 6 that, by using the third connecting structure 43 and the fourth connecting structure 44 to connect the gate dielectric areas connected with the same control signal, the wires connecting the control signal can be arranged flat and straight on the same metal layer, which can not only improve the conductive efficiency of the wire and optimize the electrical signal transmission effect, but also reduce the complexity of layout design of the wiring metal layer (i.e., the M0 layer), decrease the complexity on manufacture process, and improve the production efficiency.

Moreover, in an embodiment, when the signal of the MWL also comes from a control signal generation area 500, the first gate dielectric area 31 may be connected to the MWL through a seventh wire 57, and the fourth gate dielectric area 34 may be connected to the MWL through an eighth wire 58. Therefore, the semiconductor structure provided in the embodiments of the present disclosure may enable the four WL drive transistor groups connected to the same MWL to achieve the flat and straight wiring of wires on the same metal layer in the layout, which reduces the bending of the wires, and avoids the cross-layer of the wires, thus improving the conductive efficiency of the wires, and improving the electrical signal transmission effect.

Figure 7:
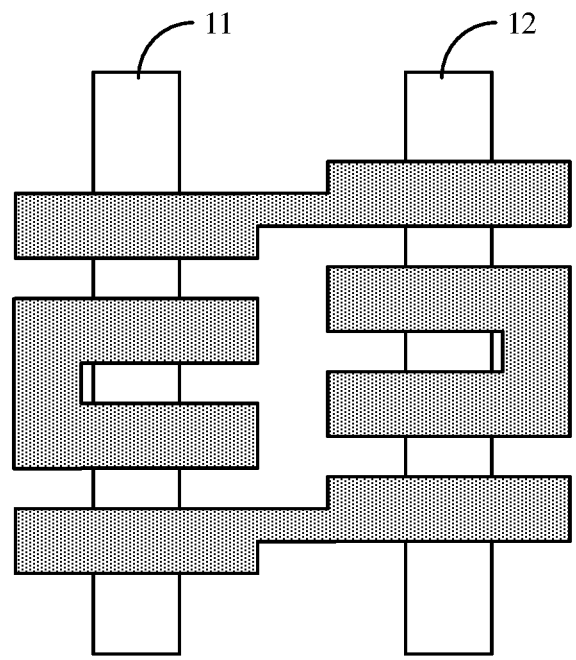
FIG. 7 is an overall schematic diagram of a semiconductor structure in an embodiment of the present disclosure.

FIG. 7 is an overall schematic diagram of a semiconductor structure in an embodiment of the present disclosure.

It can be seen from FIG. 7 that the semiconductor structure provided in the embodiments of the present disclosure has relatively straight and uniform gate dielectric areas and active areas, and realizes the connection between the gate dielectric areas connected with the same signal through multiple uniform connecting structures, enables to reduce the wiring inside the WL drive circuits, and makes the charges of each gate dielectric area uniform, thus overall improving the electrical signal transmission effect of the WL drive circuits.

Figure 8:
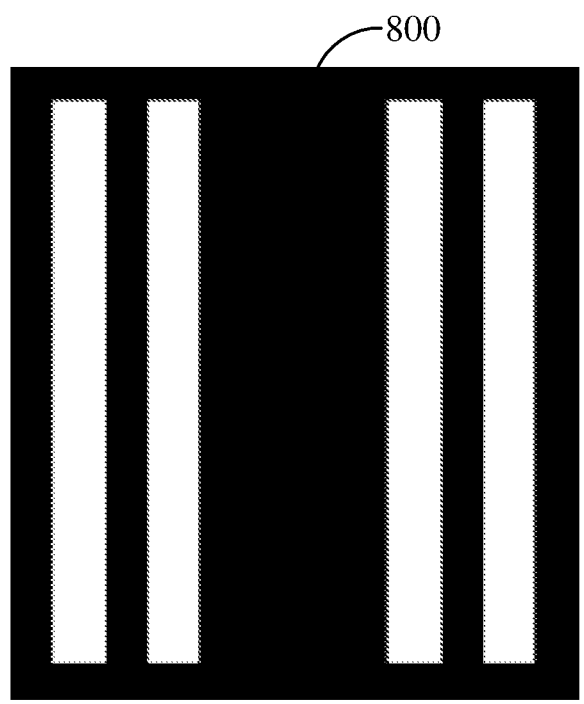
FIG. 8 is a schematic diagram of a Shallow Trench Isolation (STI) structure corresponding to a semiconductor structure in an embodiment of the present disclosure.

FIG. 8 is a schematic diagram of an STI structure corresponding to a semiconductor structure in an embodiment of the present disclosure.

With reference to FIG. 8, since the uniform and straight active areas are arranged, the active areas (blank areas in the figure) are not connected to each other. In the layout, the STI structure 800 has a neat and complete layout without the STI Island, which can reduce the stress between the STI and the active area, and improve the yield and structure stability of the integrated circuit.

Figure 9:
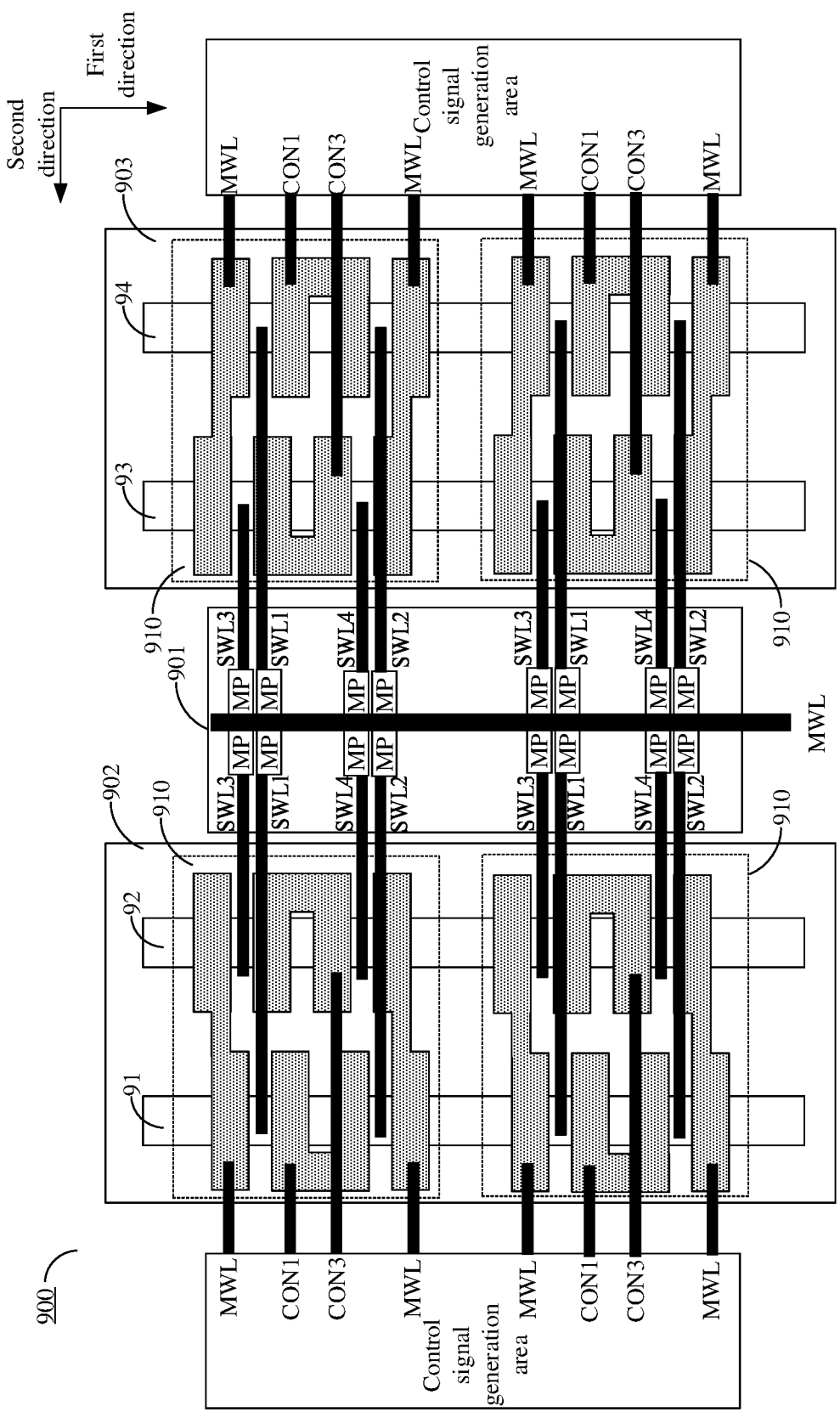
FIG. 9 is a schematic diagram of a semiconductor structure in an embodiment of the present disclosure.

FIG. 9 is a schematic diagram of a semiconductor structure in an embodiment of the present disclosure.

With reference to FIG. 9, the semiconductor structure 900 is configured to be provided with multiple WL drive circuits of a memory which are connected to an MWL and multiple SWLs respectively corresponding to multiple WL drive circuits. The semiconductor structure 900 may include a first layout area 901, a second layout area 902 and a third layout area 903.

The first layout area 901 is configured to be provided with multiple P-type transistors MP corresponding to the multiple WL drive circuits. For each P-type transistor, a gate of the P-type transistor MP is connected to the MWL, a drain of the P-type transistor MP is connected to a respective one of the SWLs SWL1 to SWL8 of the corresponding WL drive circuit, and a source of each P-type transistor is connected to the power supply voltage.

The second layout area 902 includes multiple semiconductor structures 910 of the embodiments shown in FIG. 1 to FIG. 7. The semiconductor structures 910 in the second layout area 902 share a first active area 91 and a second active area 92.

The third layout area 903 includes multiple semiconductor structures 910 of the embodiments shown in FIG. 1 to FIG. 7. The semiconductor structures 910 in the third layout area 903 share a further first active area 93 and a further second active area 94.

The second layout area 902, the first layout area 901 and the third layout area 903 are sequentially arranged in parallel in the second direction.

Although the semiconductor structure shown in FIG. 6 or FIG. 7 is shown in FIG. 9, the semiconductor structures shown in FIG. 1 to FIG. 5 are also within the scope of protection of the embodiment shown in FIG. 9.

At the same time, combined with the wires shown in FIG. 6, all the control signal lines of each semiconductor structure 910 and the control signal generation area are displayed.

It can be seen from the embodiment shown in FIG. 9 that when the semiconductor structure in the above embodiment is applied to the centralized layout of the WL drive circuits, the formed layout of the WL drive circuits has not only uniform and straight active areas and gate dielectric areas, but also straight and uniform wires on the same metal layer. That is, the wiring on the M0 layer is generally in a straight line, and the wiring from an NMOS layout area (the second layout area 902 and the third layout area 903) to a PMOS layout area (the first layout area 901) has no bending, which greatly reduces the defect (M0 defect) of a metal wire layer and improves the manufacture process stability.

At the same time, because the wiring is uniform and straight without threading layers, the complexity of the layout design on the wiring metal layer (i.e., the M0 layer) is reduced, the conductive effect of wires is optimized, the manufacturing complexity is decreased, and the production efficiency is improved.

According to the third aspect of the present disclosure, a chip is provided, which may include the semiconductor structure described above.

It is to be noted that, although multiple modules or units of the device for action execution are mentioned in the foregoing detailed descriptions, this division is not mandatory. Actually, according to the implementations of the disclosure, the foregoing described features and functions of two or more modules or units may be embodied in one module or unit. On the contrary, the foregoing described features and functions of a module or unit may further be embodied by multiple modules or units.

Other implementations of the present disclosure will be apparent to those skilled in the art upon consideration of the description and practice of the present disclosure. This present disclosure is intended to cover any variations, usages, or adaptations of the present disclosure that follow the general principles thereof and including commonly known or customary practice in the art that are not disclosed herein. The description and embodiments are considered exemplary only, and the true scope and concept of the present disclosure are indicated by the claims.

The invention claimed is:

1. A semiconductor structure, comprising:
a first active area, configured to extend along a first direction and have a first width in a second direction, wherein the second direction is perpendicular to the first direction;
a second active area, configured to extend along the first direction and have the first width in the second direction;
a first WordLine (WL) drive transistor group, which is formed based on the first active area and comprises two gate dielectric areas connected to the first active area, wherein one of the two gate dielectric areas is connected to a Main-WordLine (MWL), and the other of the two gate dielectric areas is connected to a first control signal line;
a second WL drive transistor group, which is formed based on the first active area and comprises two gate dielectric areas connected to the first active area, wherein one of the two gate dielectric areas is connected to the MWL, and the other of the two gate dielectric areas is connected to a second control signal line;
a third WL drive transistor group, which is formed based on the second active area and comprises two gate dielectric areas connected to the second active area, wherein one of the two gate dielectric areas is connected to the MWL, and the other of the two gate dielectric areas is connected to a third control signal line; and
a fourth WL drive transistor group, which is formed based on the second active area, and comprises two gate dielectric areas connected to the second active area, wherein one of the gate dielectric areas is connected to the MWL, and the other one of the gate dielectric areas is connected to a fourth control signal line;
wherein each of the gate dielectric areas is configured to extend along the second direction and have a second width in the first direction.

2. The semiconductor structure of claim 1, wherein the first WL drive transistor group comprises a first transistor and a second transistor, a gate of the first transistor is a first gate dielectric area, a gate of the second transistor is a second gate dielectric area, and a part, located between the first gate dielectric area and the second gate dielectric area, of the first active area is a common drain of the first transistor and the second transistor;
   the second WL drive transistor group comprises a third transistor and a fourth transistor, a gate of the third transistor is a third gate dielectric area, a gate of the fourth transistor is a fourth gate dielectric area, and a part, located between the third gate dielectric area and the fourth gate dielectric area, of the first active area is a common drain of the third transistor and the fourth transistor;
   the third WL drive transistor group comprises a fifth transistor and a sixth transistor, a gate of the fifth transistor is a fifth gate dielectric area, a gate of the sixth transistor is a sixth gate dielectric area, and a part, located between the fifth gate dielectric area and the sixth gate dielectric area, of the second active area is a common drain of the fifth transistor and the sixth transistor; and
   the fourth WL drive transistor group comprises a seventh transistor and an eighth transistor, a gate of the seventh transistor is a seventh gate dielectric area, a gate of the eighth transistor is an eighth gate dielectric area, and a part, located between the seventh gate dielectric area and the eighth gate dielectric area, of the second active area is a common drain of the seventh transistor and the eighth transistor.

3. The semiconductor structure of claim 2, wherein the first gate dielectric area, the second gate dielectric area, the third gate dielectric area and the fourth gate dielectric area are sequentially arranged on the first active area in parallel along the first direction; the fifth gate dielectric area, the sixth gate dielectric area, the seventh gate dielectric area and the eighth gate dielectric area are sequentially arranged on the second active area in parallel along the first direction; and the first gate dielectric area, the fourth gate dielectric area, the fifth gate dielectric area and the eighth gate dielectric area are connected to the MWL.

4. The semiconductor structure of claim 3, wherein the first gate dielectric area is connected to the fifth gate dielectric area, the fourth gate dielectric area is connected to the eighth gate dielectric area, the first gate dielectric area and the fifth gate dielectric area have a first distance in the first direction, and the fourth gate dielectric area and the eighth gate dielectric area have the first distance in the first direction.

5. The semiconductor structure of claim 4, wherein the second gate dielectric area and the sixth gate dielectric area have the first distance in the first direction, and the third gate dielectric area and the seventh gate dielectric area have the first distance in the first direction.

6. The semiconductor structure of claim 4, wherein the first gate dielectric area is connected to the fifth gate dielectric area through a first connecting structure which is configured to extend along the second direction and have a third width in the first direction, the third width being less than the second width; and the fourth gate dielectric area is connected to the eighth gate dielectric area through a second connecting structure which is configured to extend along the second direction and have the third width in the first direction.

7. The semiconductor structure of claim 6, wherein a first edge of the first connecting structure in the first direction is flush with a first edge of the first gate dielectric area in the first direction, and a second edge of the first connecting structure in the first direction is flush with a second edge of the fifth gate dielectric area in the first direction; and a first edge of the second connecting structure in the first direction is flush with a first edge of the fourth gate dielectric area in the first direction, and a second edge of the second connecting structure in the first direction is flush with a second edge of the eighth gate dielectric area in the first direction.

8. The semiconductor structure of claim 3, wherein the first control signal line and the second control signal line are the same signal line, the third control signal line and the fourth control signal line are the same signal line, the second gate dielectric area is connected to the third gate dielectric area, and the sixth gate dielectric area is connected to the seventh gate dielectric area.

9. The semiconductor structure of claim 8, wherein the second gate dielectric area is connected to the third gate dielectric area through a third connecting structure which is configured to extend along the first direction and is located on a side, away from the second active area, of the first active area in the second direction; and the sixth gate dielectric area is connected to the seventh gate dielectric area through a fourth connecting structure which is configured to extend along the first direction and is located on a side, away from the first active area, of the second active area in the second direction.

10. The semiconductor structure of claim 9, wherein the third connecting structure is connected to a first terminal of the second gate dielectric area and a first terminal of the third gate dielectric area, and the fourth connecting structure is connected to a second terminal of the sixth gate dielectric area and a second terminal of the seventh gate dielectric area.

11. The semiconductor structure of claim 4, wherein the common drain of the first transistor and the second transistor is connected, through a first wire, to a first Sub-WordLine (SWL) corresponding to the first WL drive transistor group; and the common drain of the third transistor and the fourth transistor is connected, through a second wire, to a second SWL corresponding to the second WL drive transistor group; wherein the first wire and the second wire are parallel in the first direction, and the first wire and the second wire are located on the same metal layer; and
   the common drain of the fifth transistor and the sixth transistor is connected, through a third wire, to a third SWL corresponding to the third WL drive transistor group; and the common drain of the seventh transistor and the eighth transistor is connected, through a fourth wire, to a fourth SWL corresponding to the fourth WL drive transistor group; wherein the third wire and the fourth wire are parallel in the first direction, and the third wire and the fourth wire are located on the same metal layer.

12. The semiconductor structure of claim 11, wherein the first wire is connected to a drain of a first P-type transistor corresponding to the first WL drive transistor group, the second wire is connected to a drain of a second P-type transistor corresponding to the second WL drive transistor group, the third wire is connected to a drain of a third P-type transistor corresponding to the third WL drive transistor group, and the fourth wire is connected to a drain of a fourth P-type transistor corresponding to the fourth WL drive transistor group; wherein the first P-type transistor, the second P-type transistor, the third P-type transistor and the fourth P-type transistor are all arranged in a first layout area; the first active area and the second active area are both arranged in a second layout area; and the first layout area and the second layout area are arranged in parallel in the second direction.

13. The semiconductor structure of claim 5, wherein the second gate dielectric area is connected to a fifth wire, the sixth gate dielectric area is connected to a sixth wire, the fifth wire and the sixth wire are parallel in the first direction, and the fifth wire and the sixth wire are located on the same metal layer.

14. The semiconductor structure of claim 11, wherein the first WL drive transistor group further includes a first P-type transistor, the second WL drive transistor group further includes a second P-type transistor, the third WL drive transistor group further includes a third P-type transistor, and the fourth WL drive transistor group further includes a fourth P-type transistor, and wherein a source of the first P-type transistor is connected to a power supply, a gate of the first P-type transistor is connected to the MWL, and a drain of the first P-type transistor is connected to the drain of the first transistor and the first SWL, a source of the second P-type transistor is connected to the power supply, a gate of the second P-type transistor is connected to the MWL, and a drain of the second P-type transistor is connected to the drain of the third transistor and the second SWL, a source of the third P-type transistor is connected to the power supply, a gate of the third P-type transistor is connected to the MWL, and a drain of the third P-type transistor is connected to the drain of the fifth transistor and the third SWL, and a source of the fourth P-type transistor is connected to the power supply, a gate of the fourth P-type transistor is connected to the MWL, and a drain of the fourth P-type transistor is connected to the drain of the seventh transistor and the fourth SWL.

15. A semiconductor structure, configured to be provided with a plurality of WordLine (WL) drive circuits of a memory which are connected to a Main-WordLine (MWL) and a plurality of Sub-WordLines (SWL) respectively corresponding to the plurality of WL drive circuits, the semiconductor structure comprising:
    a first layout area, configured to be provided with a plurality of P-type transistors corresponding to the plurality of WL drive circuits; for each P-type transistor, a gate of the P-type transistor is connected to the MWL, a drain of the P-type transistor is connected to the SWL of a respective WL drive circuit, and a source of the P-type transistor is connected to a power supply voltage;
    a second layout area, comprising a plurality of semiconductor structures of claim 1, wherein the plurality of semiconductor structures in the second layout area are configured to share a first active area and a second active area; and
    a third layout area, comprising a plurality of semiconductor structures of claim 1, wherein the plurality of semiconductor structures in the third layout area are configured to share a further first active area and a further second active area;
    wherein the second layout area, the first layout area and the third layout area are sequentially arranged in parallel in the second direction.

16. A chip, comprising the semiconductor structure of claim 1.

* * * * *